US010267625B2

(12) United States Patent
Goodwin

(10) Patent No.: US 10,267,625 B2
(45) Date of Patent: Apr. 23, 2019

(54) DETERMINATION OF OPERABILITY OF A DIGITAL SCANNER WITH SHEARING INTERFEROMETRY

(71) Applicant: Nikon Corporation, Tokyo (JP)

(72) Inventor: Eric Peter Goodwin, Oro Valley, AZ (US)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/897,248

(22) Filed: Feb. 15, 2018

(65) Prior Publication Data
US 2018/0172437 A1 Jun. 21, 2018

Related U.S. Application Data

(63) Continuation-in-part of application No. 15/632,849, filed on Jun. 26, 2017.

(60) Provisional application No. 62/459,825, filed on Feb. 16, 2017, provisional application No. 62/356,069, filed on Jun. 29, 2016.

(51) Int. Cl.
G01B 11/24 (2006.01)
G01M 11/00 (2006.01)
G03F 7/20 (2006.01)
G01J 9/02 (2006.01)

(52) U.S. Cl.
CPC ............ *G01B 11/2441* (2013.01); *G01J 9/02* (2013.01); *G01M 11/005* (2013.01); *G03F 7/70075* (2013.01); *G03F 7/70116* (2013.01); *G03F 7/70291* (2013.01); *G03F 7/70591* (2013.01)

(58) Field of Classification Search
CPC .......... G01B 11/2441; G01B 9/020234; G01B 9/02038; G01B 9/02097; G01B 9/02098; G01M 11/0271
See application file for complete search history.

(56) References Cited

U.S. PATENT DOCUMENTS

| 7,158,238 B2* | 1/2007 | Latypov | G01J 9/0215 250/201.9 |
| 7,402,785 B2* | 7/2008 | Barchers | G01J 9/00 250/201.9 |
| 7,768,653 B2* | 8/2010 | Latypov | G03F 7/706 356/515 |

* cited by examiner

Primary Examiner — Jonathan M Hansen
(74) Attorney, Agent, or Firm — Yakov S. Sidorin; Quarles & Brady LLP

(57) ABSTRACT

System and method for monitoring of performance of a mirror array of a digital scanner with a use of a lateral shearing interferometer (operated in either static or a phase-shifting condition) to either simply identify problematic pixels for further troubleshooting or measure the exact magnitude of the mirror's deformation.

26 Claims, 10 Drawing Sheets

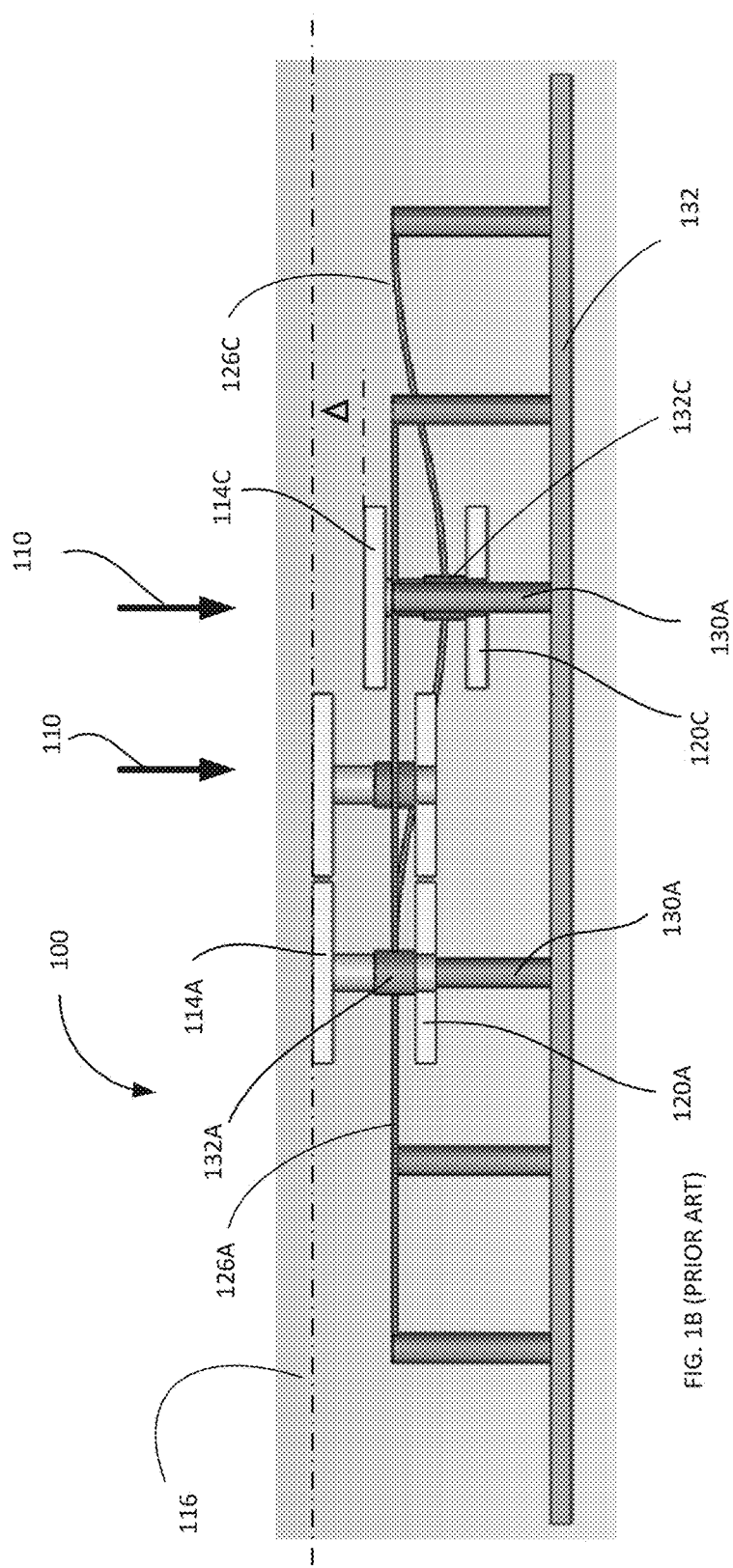

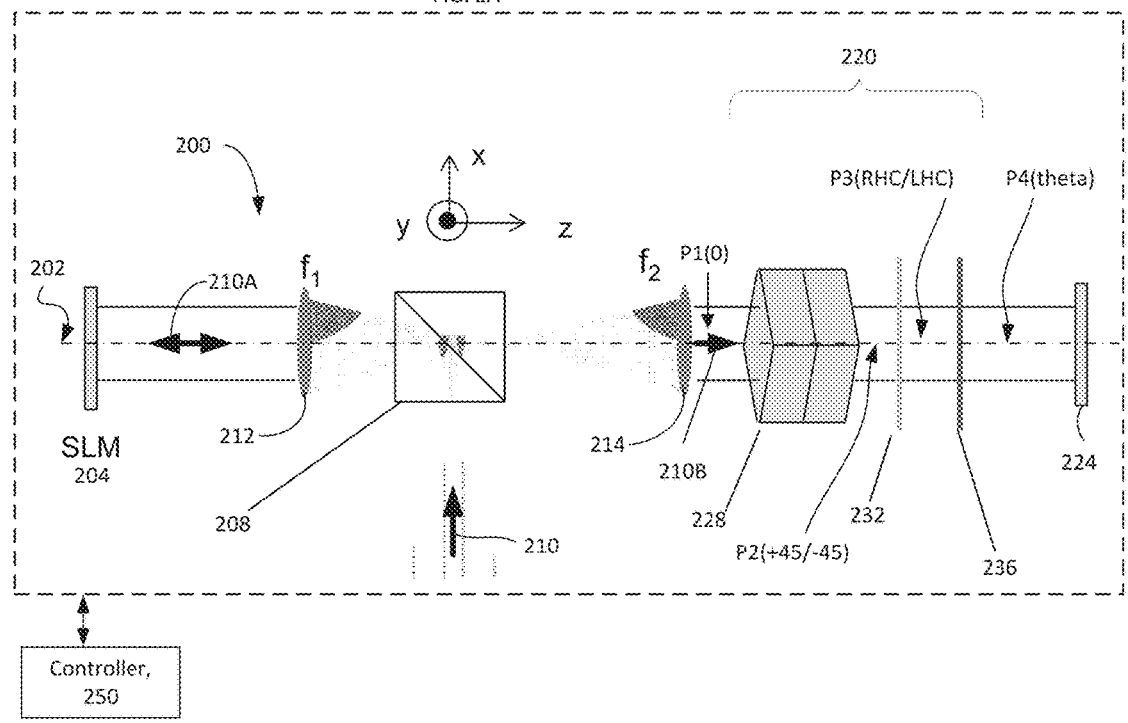
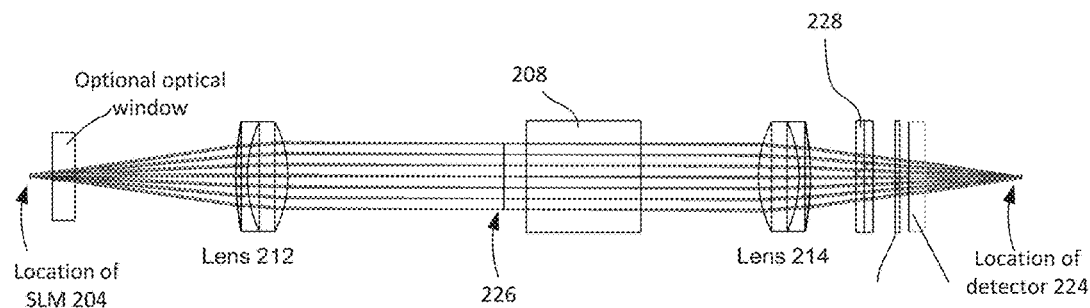

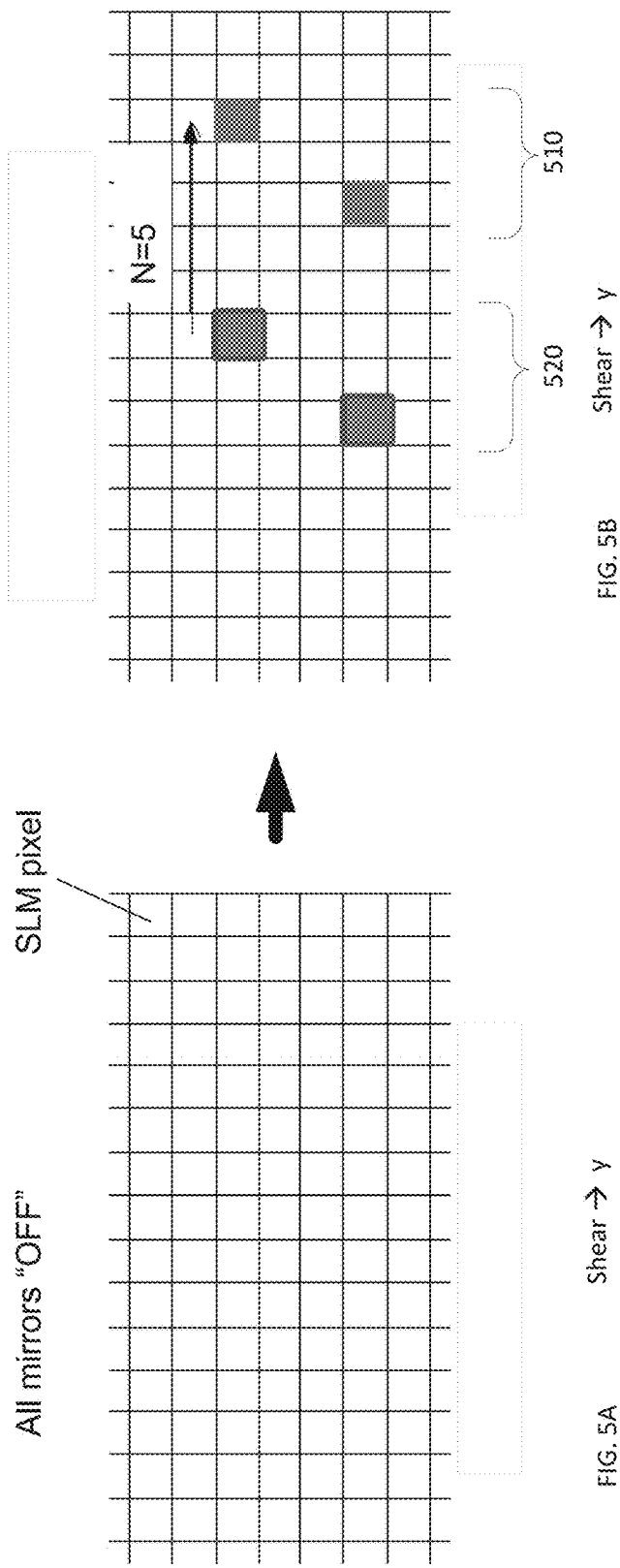

DETERMINATION OF OPERABILITY OF A DIGITAL SCANNER WITH SHEARING INTERFEROMETRY

CROSS-REFERENCE TO RELATED APPLICATIONS

This application claims priority from and benefit of the U.S. Provisional Patent Application No. 62/459,825 filed on Feb. 16, 2017, the disclosure of which is incorporated herein by reference. This application is also a continuation-in part of the U.S. patent application Ser. No. 15/632,849, filed on Jun. 26, 2017, now published as US 2018/003484, which claims priority from the U.S. Provisional Patent Application No. 62/356,069 filed on Jun. 29, 2016. The disclosure of each of the above-mentioned applications is incorporated herein by reference.

TECHNICAL FIELD

The present invention relates to systems and methods for non-contact profilometry of surfaces and, more particularly, to characterization of a scanning light modulator device with the use of a lateral shearing interferometer system that comprises a portion of a digital scanner.

SUMMARY

An embodiment of the invention provides an optical imaging system comprising: —an array of reflectors having an axis normal to a surface thereof; —a first optical system configured to split an incident optical wavefront impinging thereon along the axis into first and second optical wavefronts, the first and second optical wavefronts having collinear normal vectors that are transversely shifted with respect to one another in a direction perpendicular to the axis; and —an optical detector positioned to receive light from both the first and second optical wavefronts such as to detect interference fringes produced by interference between the first and second optical wavefronts. Embodiments of the invention also provide a method for operation of such optical system. Embodiments of the invention additionally provide an inspection apparatus configured to inspect an array of reflective surfaces arranged on a first surface. The inspection apparatus comprises an irradiating system configured to irradiate said array with a first radiation. The inspection apparatus additionally comprises an optical system having a first axis, the first axis being an optical axis of the optical system, the optical system (i) being disposed to receive a second radiation from the array and deliver said second radiation to a second surface, the first and second surfaces being optically-conjugate to one another, wherein the second radiation includes the first radiation reflected by said array, and (ii) including a radiation divider configured to divide the second radiation into first and second portions of the second radiation, each of the first and second portions continuing to propagate towards the second surface. The inspection apparatus also includes an optical detector disposed on the second surface and configured to receive and detect the first and second portions of the second radiation.

BRIEF DESCRIPTION OF THE DRAWINGS

The invention will be more fully understood by referring to the following Detailed Description of Specific Embodiments in conjunction with the not-to scale Drawings, of which:

FIGS. 1A, 1B illustrate an embodiment of a scanning-light modulator (SLM) MEMS-based device;

FIGS. 2A, 2B illustrate schematically an example of the optical imaging system 200 used in an embodiment of the invention and for imaging of the surface of the target onto the optical detector;

FIGS. 5A, 5B depict respectively two states of operation of an SLM, indicating a pair of "broken" individual reflecting elements;

Generally, the sizes and relative scales of elements in Drawings may be set to be different from actual ones to appropriately facilitate simplicity, clarity, and understanding of the Drawings. For the same reason, not all elements present in one Drawing may necessarily be shown in another.

DETAILED DESCRIPTION

Examples of embodiments of the present invention, discussed below, disclose methods and apparatus for a novel in-plane scanning interferometric technique the use of which facilitates surface profilometry and, in particular, profilometry of a displacement of repositionable elements of the surface thereby enabling a verification of operability of a MEMS-based device.

Non-Limiting Measurement Target

Spatial light modulators (or SLMs) are often used as part of optical imaging systems, and partake in process of relaying light, forming an image of a chosen object on an image plane, to the image plane. In particular such SLMs may be used in applications of a lithographic exposure tool or digital scanner, when a conventionally-used fixed-pattern mask or reticle that travels on a reticle-stage is replaced with a MEMS-based SLM device such as one containing a reflective surface that is discretized or split into individual mirror elements. In the following, the terms "mirror elements" and "reflecting elements" (or "reflector elements") may be used interchangeably as applied to an SLM device that contains an array of such mirror elements (or "an SLM array", or a "mirror array", for short).

Figure 1A:
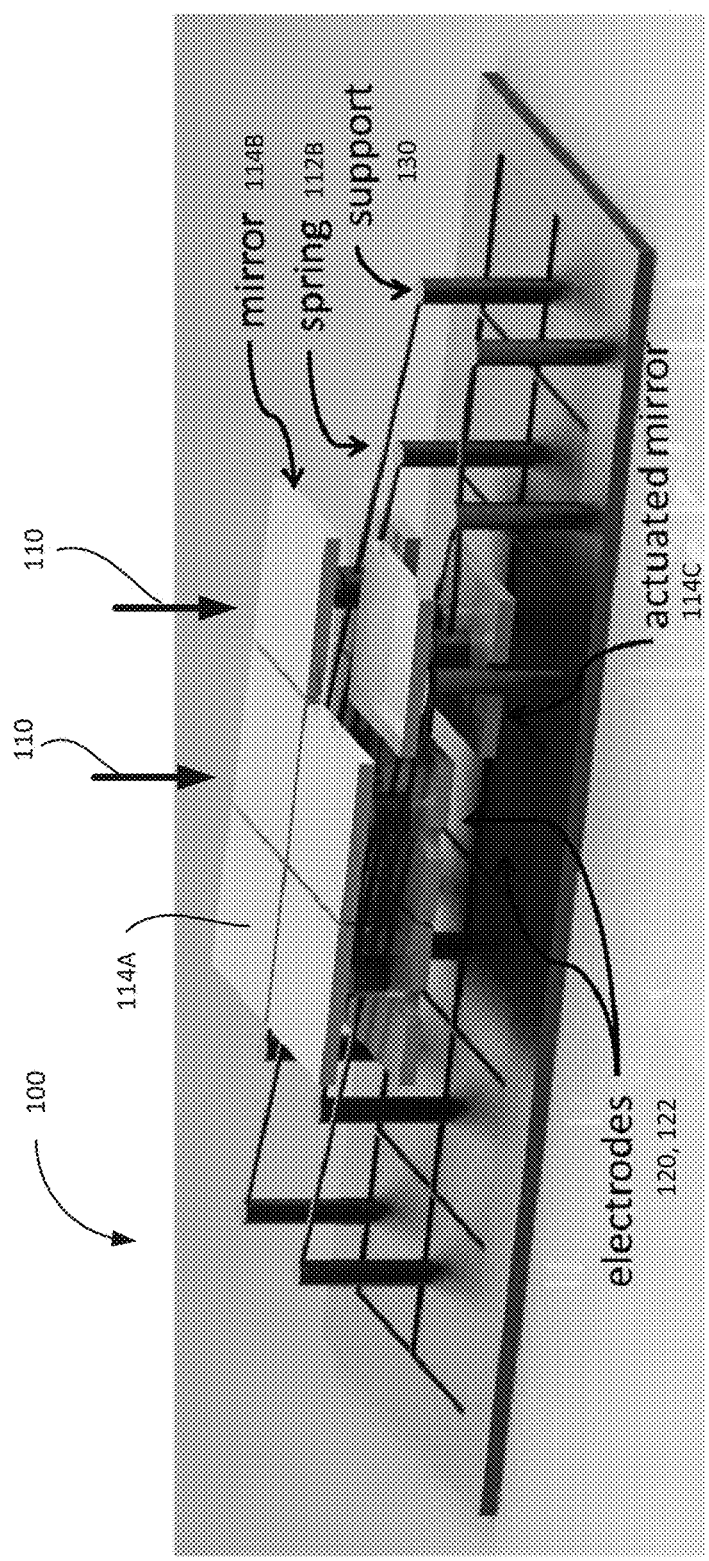

For the purpose of providing a non-limiting example of a relevant application, one can consider a specific situation, in which individual mirror elements in the SLM array are configured to move or reposition discretely or continuously along a line transverse to a surface of the device between the two extreme positions that are characterized by two corresponding values of height, of a given individual mirror element, with respect to a chosen reference level. An example 100 of such SLM array is illustrated in FIG. 1.

Each of the individual mirror elements of the array 100 is shown to include an upper reflective surface (114A, 114B, 114C) and a lower electrode surface. The transverse translation of an individual mirror can be effectuated, for example, based on the principle of electrostatic attraction and/or repulsion between an individually-addressable electrode with which a given individual micro-mirror is equipped and a based electrode that is common to all the mirrors of the device 100. The individual electrode 120C of the mirror 114C and the base electrode 122 provide but one example of the implementation of such concept. In this example, by applying an appropriate difference of potentials between the electrodes 120C, 122 sufficient to create an electrostatic force that overcomes the tensional load provided by mechanical resistance of a spring 126C juxtaposed with the mirror 114C, the mirror 114C is caused to move towards the base electrode 122.

Depending on particular details of the structural implementation of the embodiment 100, such movement may be effectuated, for example, in a sliding fashion provided by a sleeve 132C encircling the fixed support-pole 130C and, optionally, connected to the spring 126C such as to increase the potential energy stored in the spring 126C. In another example (not shown), the pole 130C may be configured as a component affixed to the micro-mirror 114C and moveable with respect to the electrode 122, in which case the movement of the micro-mirror 114C may be coordinated with the corresponding movement of the support-pole 130C in a piston-like fashion, transversely to the device surface 116. Other implementations of an individual micro-mirror direction-reversible translation in a direction transverse to the surface of the phase-modulating embodiment of the invention can be readily envisioned by a skilled artisan.

In a specific situation, where the incident light 110 has a wavelength of about 193 nm, dimensions of a given micro-mirror 114A, 114B, 114C may be on the order of a few microns (for example, of about 1 micron by 1 micron, or 2 microns by 2 microns, or 4 microns by 4 microns, or 6 microns by 6 microns, to provide non-limiting examples), and the maximum range transverse displacement A may be on the order of 40-60 nm or so. In operation, a phase-modulating embodiment such as the embodiment 100 of FIGS. 1A, 1B, imparts variable across the lightfront (light wavefront or optical wavefront) 110 phase-shift as a function of a voltage level corresponding to such micro-mirror. The term "wavefront" as used herein refers to a surface of identical phase (iso-phase surface) of propagating electromagnetic wave.

In a specific case, the two height levels may be chosen to be it-phase apart at a given wavelength of light incident onto a given mirror of the mirror array, thereby defining the whole mirror array to operate as a phase mask of the exposure tool. While such an SLM device (configured as a phase mask or reticle with respect to light incident upon it) may be fixed in place as a whole, it may be programmed to change a spatial pattern of distribution of individual mirror element(s) across the mirror array, for example in a fashion synchronized with the motion of the semiconductor wafer in the exposure tool. Generally, however, individual reflecting elements from the mirror array of the SLM device may be configured to change their positions independently from one another.

Should a mirror element of the mirror array fail, the pattern of the phase mask that is based on the use of such SLM changes as compared to the desired or pre-determined pattern, and, as a result, the pre-determined light distribution is not transferred to (printed on) the wafer but instead a light distribution that deviated from the pre-determined one is being transferred there. Such deviated-from-the-pre-determined imaging process causes the formation of an image, on the wafer, which differs from the intended, target image. Understandably, the ability to measure the phase (or displacement) of each individual mirror element of such phase mask to determine if it is working properly (in both "on" and "off" states of the digital scanner) is of operational importance. While the operational significance of the detrimental effect on results of the imaging process, imposed by an SLM that has "gone bad" (in that individual reflector(s) of the SLM modulate a wavefront of image-forming light distribution) depends, of course, on the number of individual reflectors that "misbehave", this does not change the nature and the scope of the problem incurred in practice.

This problem, as was already mentioned, is associated with operation of a spatially-discretized reflector—such as an SLM that is formed by an array of constituent, individual reflectors—and is caused by a lack of knowledge of whether a displacement of a given individual reflector is as predetermined by design of the SLM or, to the contrary, occurs in an unpredictable fashion.

Any known to-date process of determination of whether an individual constituent reflector of an SLM mirror array operates as intended (that is, is "fit" for use as intended) or misbehaves (that is, is "unfit" for use as intended) is tedious, complex, and requires time that warrants a substantial interruption of the lithographic exposure process to effectuate imaging of the surface of the SLM mirror array at multiple positions while scanning or repositioning of the SLM device with respect to the chosen optical imaging system.

In contradistinction with related art, embodiments of the present invention provide a solution of this problem by performing metrology of the specified region of interest of the SLM mirror array at a normal incidence with the use of an interferometer device while not employing (that is, in absence of) scanning or repositioning of the SLM device, as a whole, with respect to such interferometer if the field-of-view (FOV) of the lens imaging the SLM device through the interferometer onto the optical detector is chosen to be sufficiently large. (The movements of individual mirror elements, of course, are considered to be part of the operation of the SLM and are not subject to the above restriction).

The employed interferometer device is a lateral shearing interferometer (or lateral SI, or LSI) as discussed below. Accordingly, the absence of scanning or repositioning of the SLM device as a whole includes, in particular, lack of repositioning of the SLM as a whole in the direction that is transverse to the optical axis of the LSI, such optical axis being perpendicular to the surface of the SLM mirror array. In a specific implementation the proposed metrological methodology is implemented, instead, only due to a rotation of an element of the lateral SI about the optical axis the relative movement along a plane of the array. Two modes of operation of the lateral SI can be contemplated in embodiments of the invention. In the first mode (referred to herein as a static mode or a static condition), the polarizer element of the lateral SI is rotated once to assume a fixed position at which the entire lateral SI is set at or near a region of operation that is characterized by the highest sensitivity of the operation to a change in irradiance of light passing through the lateral SI. The second mode of operation (referred to herein as a phase-shifting mode or a phase-shifting condition) includes performing the phase shifting measurement by multiply rotating the polarizer of the lateral SI about the optical axis and collecting data at each incremental point of such rotation.

Put differently, embodiments of the invention address the persisting industrial need in easy monitoring of the performance of the mirror array of the digital scanner. The provided solution includes the use of an optical imaging system that comprises a normal-incidence lateral shearing interferometer (which can be operated in a static condition or in a phase-shifting condition) configured to interferometrically compare two laterally-sheared images of the mirror array to determine phase errors (piston errors) of the wavefront, caused by the operation of the mirror array.

Examples of Embodiments

In one implementation of the lithographic exposure tool, the lithographic exposure tool is configured as a digital scanner (DS) tool, in which individual mirror element from an array of micromirrors (comprising a part of the SLM) can move in z-direction (that is, along the optical axis of the projection lens of the digital scanner), to 2 discrete positions that respectively correspond to 0 and π phase for a light wavefront reflected by the array. In one configuration, the wavelength of light is chosen to be 193 nm, and this wavelength is further used for the purposes of illustration, and without any implied limitations, in the rest of the present disclosure. In reference to FIG. 1B, the spatial separation $\Delta=\Delta z$ between the two positions of an individual mirror, in operation of the array, is therefore about $193/4=48.25$ nm. (A person of skill in the art will readily understand that an additional factor of 2 comes from the fact that these are individual mirrors used in reflection, such that the wavefront change due to a mirror motion of 48.25 nm is 2*48.25=96.5 nm). The goal achieved by implementations of the present embodiments invention is the ability to measure the z-offset of the entire SLM (the "health" of the SLM) while the SLM is installed in a digital scanner (DS) tool. Such the DS tool is disclosed in US2013/02768912, for example, which is incorporated herein by reference.

While the size of each SLM individual mirror element (or pixel) is quite small, for example on the order of $4\times4$ $\mu m^2$), it is not necessary to resolve (in terms of the Airy disk criteria of resolution, well accepted in optical sciences and engineering) each SLM pixel to achieve the measurement goals. Instead, the instrument structured according to an embodiment has the ability to notice (register) and measure and record a variation in SLM performance qualitatively. According to the idea implemented in the embodiments, if a predetermined number of SLM pixels are "failing" or have other undesirable behavior, then the SLM is removed from the DS tool for further inspection with a high numerical aperture measurement (as was discussed in detail in US 2018/003484).

The idea, implemented in present embodiment(s), turns on the application of shearing interferometry to inspection of the SLM device in the DS tool. The operation of a shearing interferometer causes the optical interference of two copies of the same wavefront, which are shifted relative to each other perpendicularly to the direction of propagation of the wavefront. In the case of a continuous surface, this facilitates and allows the measurement of the surface's slope at any point of the surface, and the results of the measurement can be unwrapped with the use of data-acquisition and processing methodologies to identify/provide the surface. In the case of the SLM measurement implemented as discussed in this application, however, the lateral SI is judiciously configured to ensure that the shift, introduced between the two copies or versions of the light wavefront, corresponds to an integer number N of SLM pixels. This condition is imposed in order to ensure that the phase difference between the phases of the portions of the wavefront reflected by the pixels that are distanced from each other by N pixels (that is, PixelA and $Pixel_{A+N}$) is visible and/or shown and/or otherwise detected in the resulting interferogram, which is acquired with an appropriately configured optical detection electronic circuitry.

FIG. 2A shows schematically an example of the optical imaging system 200 used in an embodiment. In the DS tool, the SLM 204 is disposed on a repositioning stage (not shown) that can be operated to move the SLM 204 away from the projection lens of the exposure tool during wafer exchange, for example, to allow it to be tested at normal incidence as shown here.

A beamsplitter, BS, 208 (which may be implemented either as a 50/50 amplitude beamsplitter, or a polarization beamsplitter PBS complemented with a quarter-waveplate QWP positioned between the PBS and the SLM and used to rotate the state of polarization of light passing through it) is used to introduce the illumination beam 210 from the optical source (not shown) into the system 200. The light 210A, delivered to the SLM 204 through the lens 212 with the focal length $f_1$, along an axis 202 is reflected and relayed through the BS 208 and the lens 214 with the focal length $f_2$ as beam 210B to the lateral shearing interferometer portion 220 of the system 200. Notably, while FIG. 2A appears to indicate that the point of convergence of the input beam of light 210 falls in the vicinity of the surface of the BS 208, such configuration is not critical for practicing the invention and, in addition, is specifically avoided in one of the implementations.

The same optics is used to relay the optical wavefront reflected from the SLM onto the camera or optical detector 224 to form the image of the SLM, as shown in FIG. 2B, where line 226 indicates the position of an aperture stop. (Note that while in FIG. 2B the system is shown with a doublet lens for lenses 212, 214, in an alternative embodiment a microscope objective or similarly well-corrected optical lens system can be employed for any of these lenses to obtain a substantially diffraction limited performance over a large field of view at the SLM.)

To avoid potential problems with variations in phase-shift changes with respect to a field position (which can be caused by the optional use of a diffraction grating or an optically-birefringent wedge element for creating a copy of the wavefront 210 near the pupil of the imaging system, since the light is converging/diverging in this optical space), an alternative means—specifically, the Savart plate is used in this specific example as a wavefront duplicating (via lateral shearing) optical element 228. Such combination creates two parallel sheared copies of the input wavefront. The use of either diffraction grating element or an optically-birefringent wedge element as component 228 remains within the scope of the invention.

Figure 3:
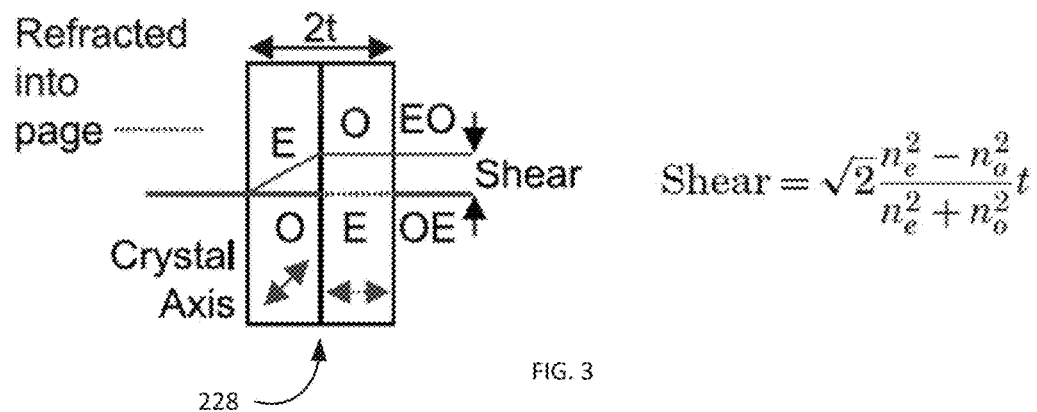
FIG. 3 is a schematic illustration of Savart plate

FIG. 3 illustrates schematically a Savart plate, and the dashed/dotted line indicates a path of the lightbeam refracted by a component of the Savart plate 228 transversely to the axis 202 (as shown—into the page of FIG. 3). As known, the Savart plate is composed of two combined identical uniaxial crystal plates with their optical axes cut at 45 degrees to the plate's normal. The amount of "shear" between the two beams of light, formed from the beam of light incident onto the Savart plate as a result of transmission of the incident beam through the Savart plate (such beams can be referred to as measurement and reference beams, for example) depends on the values of the indices of refraction of the Savart plate's material no and ne for ordinary and extraordinary beams of light propagating through the plate and on the overall thickness t of the plate.

In further reference to FIG. 2A, the linearly polarized input beam 210B incident onto the element 228 at point Pi is oriented at 0° with respect to the reference direction (as shown in FIG. 2A with the marker P1(0)), while the crystal axis of the Savart plate 228 is rotated at 45°. The result is two orthogonally polarized (at +/−)45° beams, produced by the element 228 upon the traversal of the beam 210B therethrough, which two beams are shifted (sheared) by the amount given in FIG. 3. In FIG. 2A, this is indicated with the marker P2(+45/−45). In reference to the specific example shown in FIG. 2A, since the Savart plate 228 is "clocked" to 45°, the shear of the optical wavefront corresponding to the beam 210 impinging onto the Savart plate occurs only along one axis of the local coordinate system (as shown—y-axis), which causes the direction of the shear to align with one axis of the SLM array. The thickness t of the element 228 is judiciously chosen such that N is equal to a predetermined integer, for example, 4. (It would be appreciated by a skilled artisan that the desired amount shear also depends on the magnification of the optical imaging system that includes lenses 212, 214).

Again, the embodiment is structured in such a way as to cause the direction of the shear to align with only one axis of the SLM array: this way, the direction of the shear is substantially parallel to one of the edges of the mirror elements. In absence of such configuration (or in absence of this condition being satisfied), the shear vector would be pointing substantially "diagonally" with respect to an individual mirror element of the SLM, which would require the Savart plate 228 to have a different—and quite possibly not easily determinable thickness, If the direction of the shear vector were random, the process of shearing at a distance substantially equal to the integer number of the pixels would be difficult to control in practice. This dictates a preference to control the orientation of the Savart plate 228.

After the Savart plate 228, a quarter wave plate (QWP) 232 is disposed with its crystal axis oriented at 0° in order to convert the polarization state that light has at point P2 to right and left hand circular (RHC, LHC) polarizations for measurement and reference beams that have traversed the element optical 232. This is indicated with the marker P3(RHC/LHC). Finally, there is an optical polarizer 236 disposed adjacent to the QWP 232 across the axis 202, to project both the RHC- and LHC-beam components into the same linear polarization state (rotated at 0 degrees) at a point P4, to enable these two portions of the lightbeam (the measurement and reference portion) to interfere optically. This is indicated in FIG. 2A with the marker P4(theta).

Figure 4:
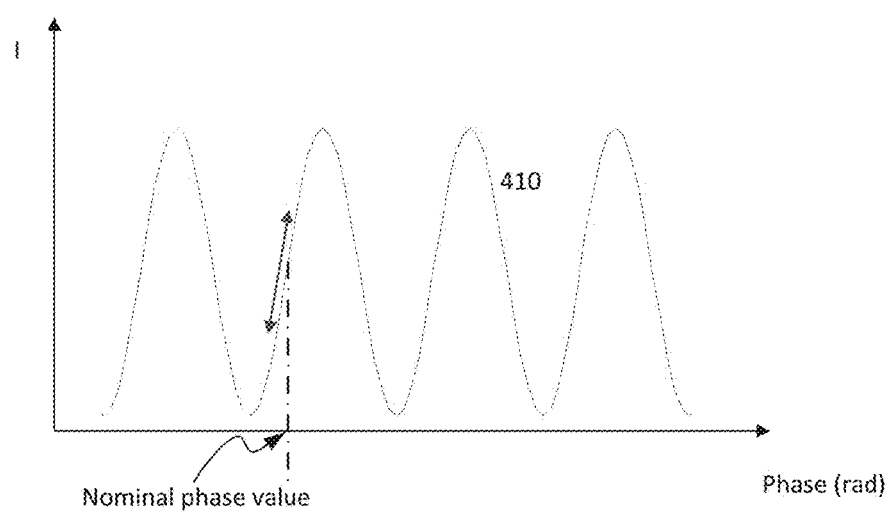
FIG. 4 is a plot representing a change of irradiance of interference between the two linearly polarized wavefronts as a function of phase.

A skilled artisan will readily appreciate that when the polarizer 236 is rotated about the optical (z) axis by Θ degrees, the relative phase difference between the LHC and RHC beams propagating through the polarizer 236 changes by 2θ. Therefore, the use of the polarizer 236 allows the system 200 to be setup/adjusted/tuned for maximum change of irradiance at the plane of the detector with respect to a phase change occuring between the interfering wavefronts forming the two images of the SLM 204 (in reflection from the SLM) in the shearing interferogram formed at the surface of the detector 224. This advantageous characteristic of the present embodiment is illustrated in FIG. 4, showing the plot 410 representing a functional change of irradiance of interference between the two linearly polarized wavefronts as a function of a phase. From this plot a person of skill will readily appreciate that the phase difference between the measurement and reference wavefronts incident onto the detector 224 from the element 236 is set at a "nominal value" chosen such that the curve 410 (as shown— the cosine curve) is at about half-maximum level, the change of irradiance as a function of phase occurs at the highest rate (and with most sensitivity) available under the circumstances.

The proposed rotation of the polarizer 236 also allows for easy implementation of the phase-shifting interferometry based measurement to take place, specifically, by rotating the polarizer 236 about the axis 202 and collecting a series of a few, for example 4-5 interferometric images formed by the detector 224, with a ΔΘ of 45° (such that the phase shift, 2*θ=90°between each two frames). The simultaneous availability of the phase shifting mode of operation in the embodiment of the invention improves the ability of the overall system to detect smaller optical phase changes corresponding to light reflected by different elements of the SLM 204 and, therefore, smaller spatial increments between spatial positions of different elements of the SLM. Such dual configuration allows the phase change to be not only determined qualitatively, but also to be quantified.

It is appreciated that the operation of the system such as system 200—especially if and when the system is operably coordinated with the exposure apparatus—is preferably governed with the appropriate controller (electronic circuitry), schematically indicated in FIG. 2A as 250.

FIGS. 5A, 5B illustrate the approximate irradiance that the operation of the system 200 effectuates. The example of the test of the SLM 204 involves setting the entire SLM array (that is, each of the individual mirror elements of the SLM) to OFF positions and then to ON positions, and comparing the two interferometric outputs acquired from the system at the detector 224. If the operation of a given individual mirror element (or pixel) of the SLM array is impeded, or deviates from the target movement (between these two positions or states) that defines the proper operation of such mirror element, such mirror element or pixel induces a phase difference that is observed when the light reflected off of it is interfered with light reflected from another, normally operating pixel that is working normally, indicated by the dark regions in FIG. 5B (here, the spatial separations between the normally working and misbehaving pairs 510, 520 of pixels is N=5). In the examples of FIGS. 5A, 5B, the phase difference between light reflected from the "broken" or "bad", misbehaving pixels 510 and the normally-operating pixels 520 will result in 2 regions of the phase map with different phases. The pixels at 510 are working correctly. This can be found by looking at the pairs of corresponding phase deviations. Each bad (520) pixel causes a phase change at its location, as well as at another location N pixels to the right (in +y direction), as shown in FIG. 5B.

Empirical Demonstrations

The practical implementation of the concept described in this disclosure provided empirical evidence that broken/ inoperable-as-intended SLM pixels were accurately identified with the embodiment 200 of the invention using the imaging NA of 0.07. In such practically-implemented system, the diameters of the off-the-shelf optical components was about 1" (except for a custom-sized element 228 to provide 16 microns of shear) to form a system with m=1 optical magnification and numerical aperture(s) variable from 0.12 to 0.03; the 2.2 micron pixel Sumix Hummingbird camera was used as the optical detector 224; the FOV of the system could be limited by varying the diameter of the aperture stop down to about 1 mm which provides the minimized NA (increasing the diameter of the aperture stop increases the NA of the imaging system). The 1650 nm SLED with about 50 micron coherence length was chosen to ensure that the optical interference (fringes) at the surface of the detector 224 was produced only by sheared images of the SLM 204, and not from coherent interference of the primary beams with multiply reflected stray beams from other places in the optical system, which stray beams are effectively eliminated from the measurements because of the short coherence length of the SLED source.

In one experiment, the system 200 was tested to detect a single pixel defect region of the chosen SLM 204.

Figure 6:
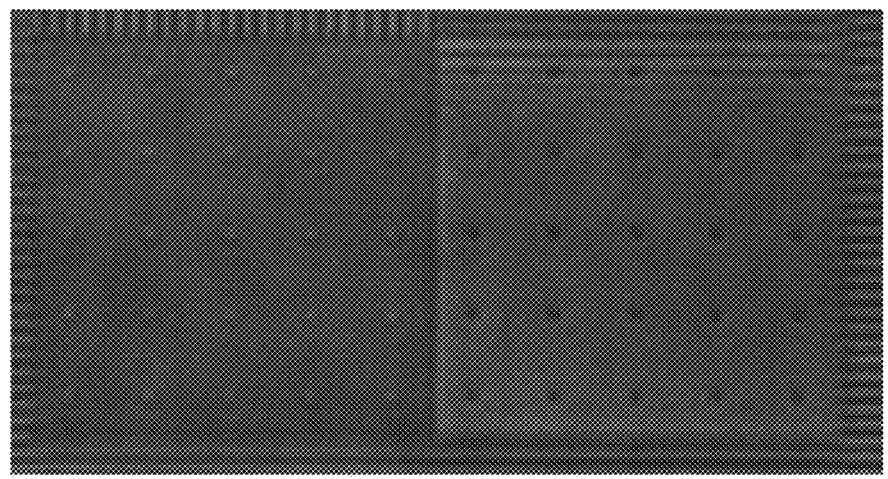
FIG. 6 presents an image of the single pixel defect with the embodiment of FIG. 2A from which the Savart plate was removed.

FIG. 6 presents an image of the single pixel defect with the system 200 from which the Savart plate 228 was removed.

Once the Savart plate is included, the system creates two interfering wavefronts, sheared by N SLM pixels. A set of 5 frames of data is collected, where the phase between the two sheared wavefront is shifted in 90° phase steps. These data are then processed with the use of a 5-frame phase-shifting algorithm to calculate the measured phase. The measured phase is then converted to height change per shear distance (referred to below as a "slope") using the wavelength of the test light and the fact that this is a reflection test. An example of the slope map is shown in FIG. 7 Shear vector is aligned in the vertical direction in the coordinates of FIG. 7.

Figure 7:
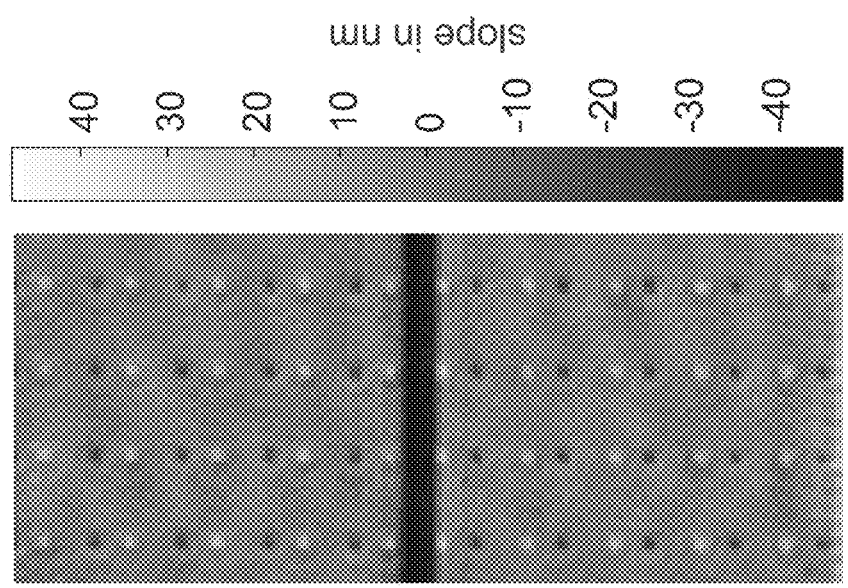
FIG. 7 is a phase map corresponding to the SLM field with a single pixel defect.
Figure 8A:
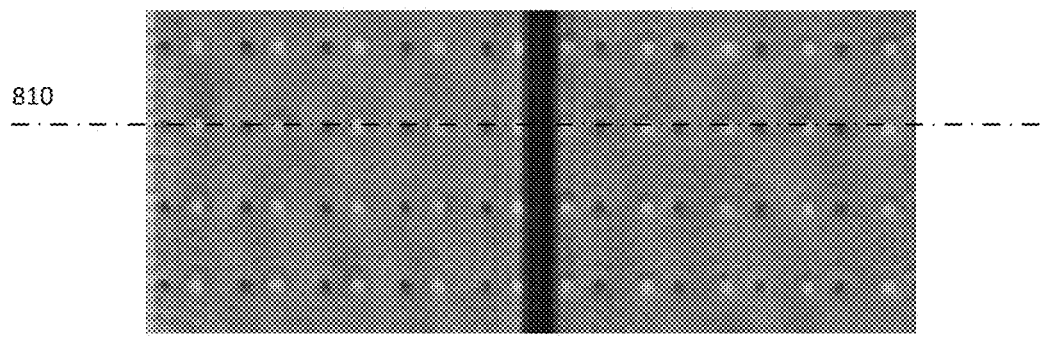
FIGS. 8A, 8B present the map of FIG. 7 rotated by 90 degrees and illustrate the profile through the pixel defect along the shear direction.
Figure 8B:
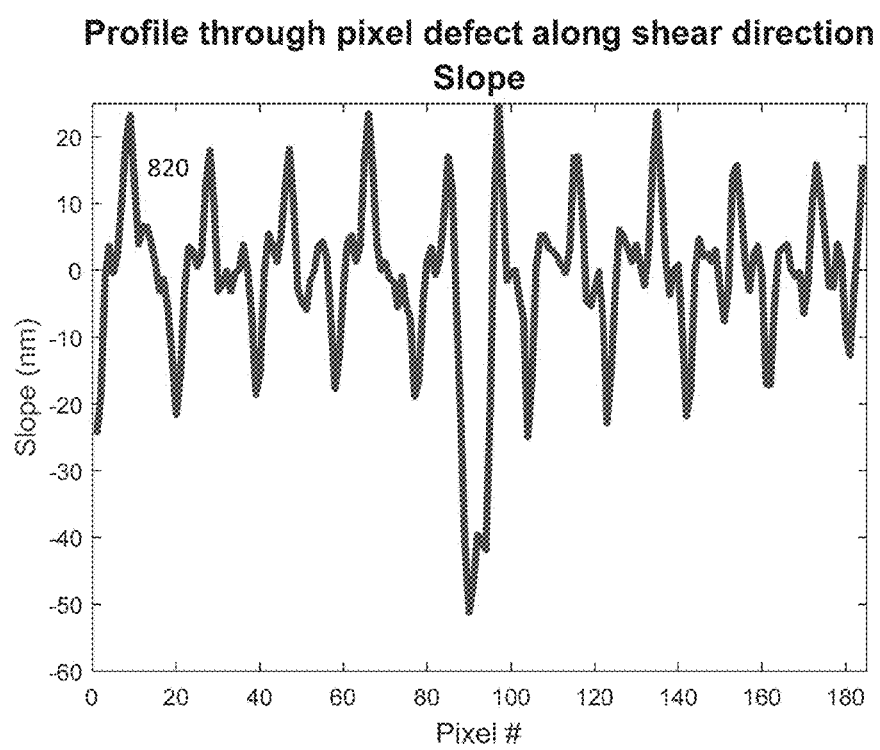

FIGS. 8A, 8B present the image of FIG. 7 rotates by 90 degrees and illustrate the profile through the slope map (the height change per shear distance map) 810 through the pixel defects along the shear direction (line 810). Based on assessment of the plot 820, the measured slope of a single pixel defect was smaller than expected (about 20 nm instead of 48 nm), which was attributed to the fact that the 4 um×4 um SLM pixels are smaller than the diffraction limit of this optical system. These sub-resolution tangible features are not fully resolved, and therefore the measured height change of each defect is less than the expected, actual height change (slope). For a given imaging NA, there will be a factor between the measured and actual height change per shear distance that can be calibrated. The calibrated factor (referred to herein as η) can then be applied to future measurements to allow the LSI to make quantitative measurements of the slope difference of isolated sub-resolution mirror elements. The difference in size d between the measured slope of the single pixel defect and the expected value is also attributed to the mismatch between the SLM pixel size and the detector (camera) pixel size.

Figure 9:
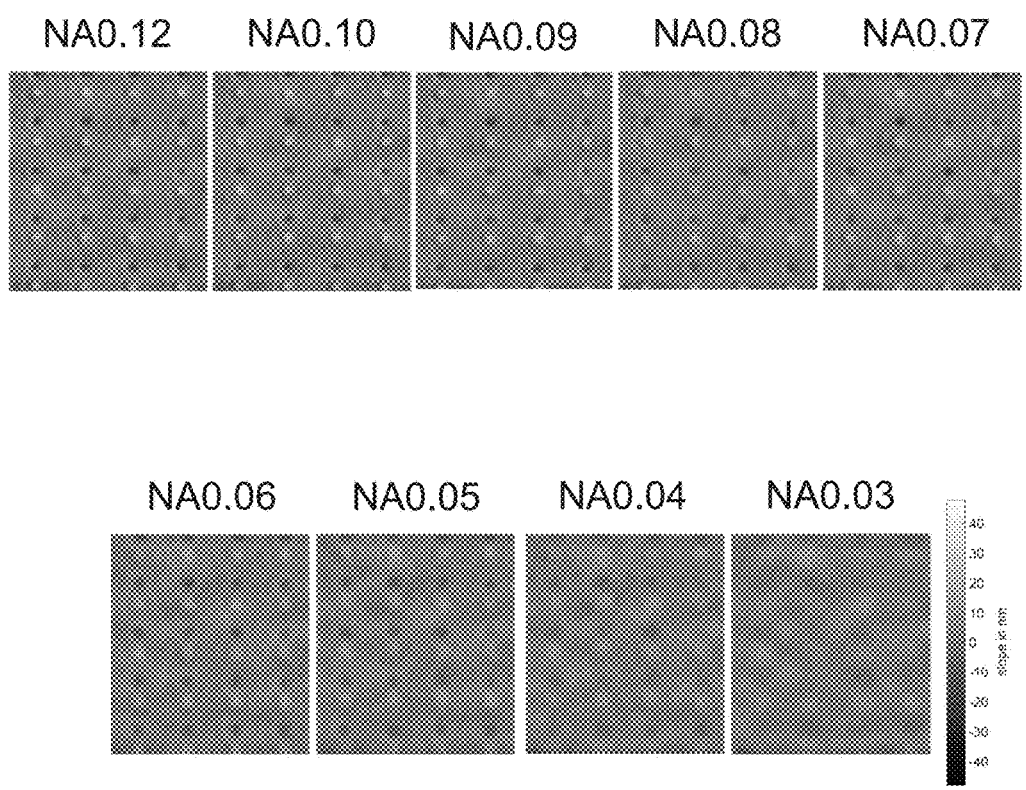
FIG. 9 presenting several images of the same SLM but obtained with different imaging lenses with different numerical apertures.

FIG. 9, presenting several images of the SLM obtained with different imaging NA 214 (NA from 0.12 down to 0.03) illustrated that the spatial resolution of the slope map degraded with a decrease of the NA. This suggests that the system can work with an NA smaller than 0.07. Most microscope objective lenses are characterized by an approximately-constant product of NA and the field of view (FOV). Therefore, if the required NA is decreased, then the measurement FOV can be increased. For a test object (such as an SLM) that is larger than the FOV of the objective lens, a larger FOV means the test device can be measured with fewer sub-regions, and therefore it can be measured faster. Accordingly, it may be important to identify the minimum NA at which the LSI can still work well. With a larger field of view (FOV) and smaller NA could be used to image a larger field of the SLM 204 during the testing measurements.

For the same mirror deviation, the measured slope change decreases with decreasing NA, and therefore the calibrated factor η will be different for each system NA. Notably, the color scale in FIG. 9 (not shown) is the same as that in FIG. 10A.

Figure 10A:
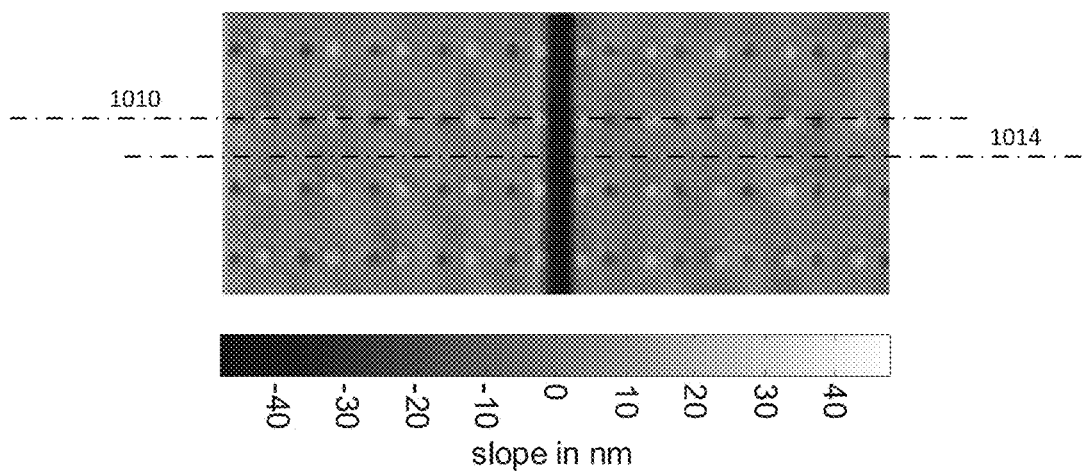
FIGS. 10A, 10B provide slope data (while comparing single pixel defect row and background row) for an image of FIG. 9 that has been acquired with NA=0.07.
Figure 10B:
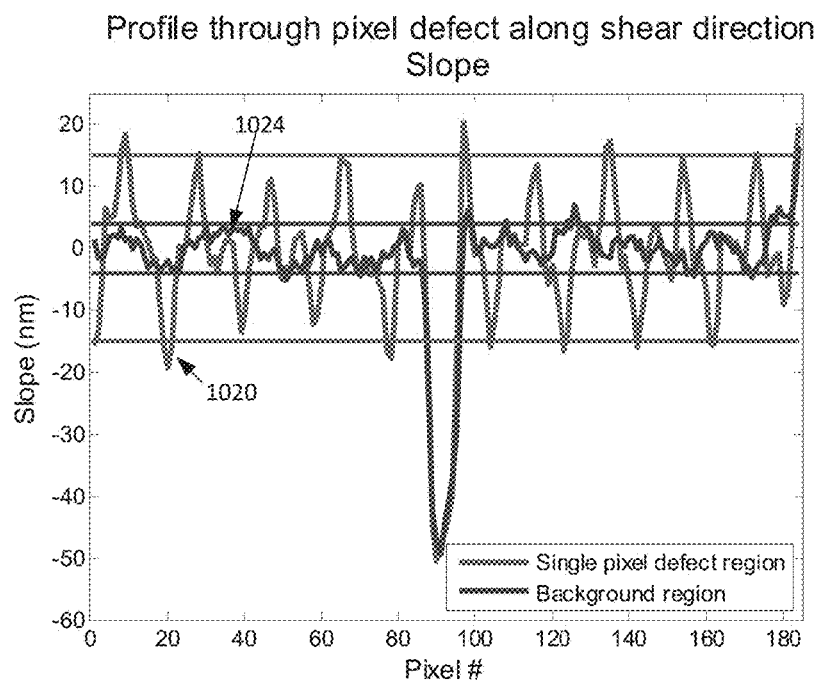

FIGS. 10A, 10B provide slope data (similar to those of FIGS. 8A, 8B) while comparing single pixel defect row 1010 and background row 1014 for imaging of the SLM with NA=0.07 (at which single pixels defects are still recognizable, as follows from FIG. 9). Here, pixel defects have a slope of +/+15 nm at NA=0.07, while the background region has fluctuations on the order of +/−4 nm—that is, the useful (corresponding to defects) signal 1020 is about 3 or more times larger than the background signal 1024 in this example.

Additional Considerations

One of the operational advantages of the proposed embodiment stems from the fact that, as would be appreciated by a skilled artisan, even in case the optical system's NA is not sufficiently large to resolve each of the SLM elements, the corresponding phase map will contain regions that are slightly darker or brighter with respect to the rest of the map, thereby indicating the locations of the misbehaving pixels of the SLM. The minimum NA required on the object side (lens 212) depends on the size of the SLM elements and the minimum resolution required under the measurement circumstance. As was already alluded to above, the product of the field size and the NA (the etendue) is similar across microscope objectives, so if the NA of the microscope objective used as the lens 212 is larger than is really needed, the field size becomes smaller. When the SLM is larger than the field of view of any suitable objective, multiple measurements may be required to measure the entire SLM. To limit the number of measurements required to a minimum results in an operational tradeoff between NA and the time it takes to complete a measurement.

In further reference to FIGS. 2A, 2B, the light source to be used with the embodiment 200 may be chosen to have limited coherence length (for example, a Superluminescent diode with a coherence length on the order of a few 10's of microns) to help prevent phase errors from coherent stray light. The choice of operational wavelength λ of the light source is important for determining the diffraction limit of the system 200. While commercially available source with wavelengths around 650 nm are common, shorter wavelengths understandably lead to better resolution for a given choice of NA of the lens 212. For example, for λ=0.65 micron and an NA of 0.15, the diffraction limit is 2.44*λ/(2*NA)=5.3 micron, which is slightly larger than a single SLM element in the considered example. An objective with this NA can be used to measure the entire 16 mm×16 mm SLM array in 4-6 measurement steps. While the individual SLM elements may not be resolvable under these circumstances, the advantage of the embodiment 200 is in that such individual resolution is not required—the system is reliably operational and producing the indication of the presence of the misbehaving pixels even in absence of being able to resolve individual pixels (that is when the individual pixel is sub-resolution of the system). Indeed, under the assumption that the majority of the SLM elements will work as they are supposed to. Indeed, if the entire array 204 works correctly, then the phase of the reflected wavefront across the SLM is constant, and so the phase map produced by the shearing interferometer based system is a constant value. However, if a few isolated SLM elements don't work, such pixels cause a local phase variation, the phase variation of which is somewhat attenuated by the limiting NA of the optical system. Measuring a phase variation due to a mirror element that is smaller than the diffraction limit is possible if the phase variation is isolated (by analogy: a small bump is easily distinguishable on a very flat surface). Accordingly, depending on whether the use of the system intends to measure the status of the SLM pixels quantitatively or qualitatively, the hardware of the system can be adjusted. The purpose of the proposed system is, therefore, to at minimum to identify problem pixels for further troubleshooting and to not necessarily measure the exact magnitude of the deformation of the SLM on the individual mirror element scale.

In some implementations, the lens 214 in the image space (on the image side) may be subject to specific numerical aperture requirements. Ideally, one SLM pixel can be mapped to at least one pixel of the detector 224 camera pixel (so the camera pixel size influences the magnification and NA of the system). However, in case when a specific (pre-existing, off-the-shelf) lens is used as the element 212, some design issues are worthy of consideration. For example, a pre-existing objective may not be necessarily corrected for spherical aberration arising due to the extra plane parallel plate components that are between lens 212 and the camera 224 (such as the element 228, and/or 232, and/or 236). The magnitude of the spherical aberration is proportional to the $NA^2$, which means it may be preferred to at least reduce or even minimize the NA in the image space. Such reduction, in turn, implies that the modulus of optical magnification produced in operation of the system 200 becomes greater than 1, so the images of the 4 micron sized SLM pixels increase in size at the surface of the detector 224. Therefore, for a given value of shear in the image space (that is, for a given number N of SLM pixels), the Savart plate 228 has to be chosen to introduce yet additional amount of shear. Therefore, the thickness of the Savart plate should be accordingly adjusted (increased), which affects the magnitude of the spherical aberration, linearly proportional to the NA. Stated differently, a linear increase in the thickness of the Savart plate 228 (caused by the increase of the magnification factor) leads to the linear increase of the amount of spherical aberration, but at the same time the value of NA is decreases linearly with the magnification factor.

A modified Savart plate (MSP, described, for example, by Saito et al., Proc of SPIE, v. 8873, 88730M-1 through 88730M-7, which publication is incorporated by reference herein) could be used if the aberrations introduced by the Savart plate 228 in the embodiment of the invention exceed a certain threshold value. Any possible alternative implementation to introduce the shear in this system besides using a Savart plate remains within a scope of the invention.

Schematic Examples of Exposure Tool and Use of Embodiment of Invention with It

Figure 11:
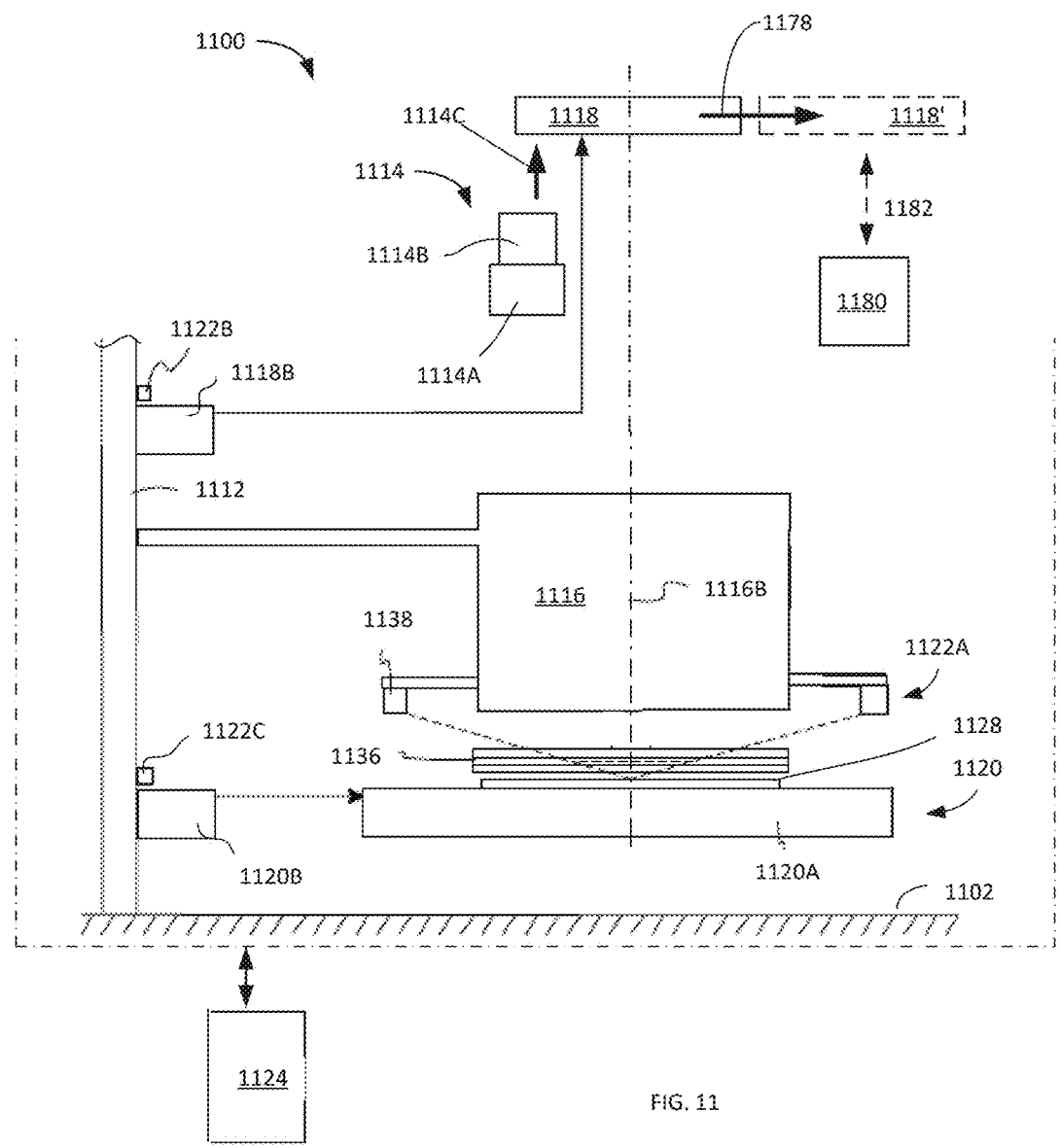
FIG. 11 illustrates an embodiment of the exposure tool cooperated with an embodiment of the invention for characterization of the operability of the SLM.

To appreciate the context and operational environment in which an embodiment of the proposed encoder head(s) may be used, a general description of a typical lithographic exposure apparatus may be useful. An example of the exposure apparatus (also interchangeably referred to as a lithographic apparatus or exposure tool) that operates in transmission, which may employ, optionally, an autofocus system (AFS) for measurements of wafer displacements is provided US 2015/0116729, which is incorporated herein by reference. FIG. 11, on the other hand, represents a version of the exposure tool in which the SLM is used to provide a reflective mask for projection of a pre-defined pattern onto the workpiece/wafer through the projection lens of the tool. This schematic illustration is substantially simplified and shown without regard to geometrical scale or precise mutual orientation and disposition of the constituent components. Not all operable connections are necessarily shown, for simplicity of illustration.

The exposure apparatus 1100 includes an apparatus frame 1112; an illumination system 1114 (also referred to as irradiation apparatus), also connected to the frame 1112; an optical assembly 1116; an SLM 1118 (disposed on the SLM stage assembly; not shown); a wafer stage assembly 1120, a positioning system (shown as a combination of several units including systems 1122A, 1122B, 1122C), and a control system 1124. The design of the components of the exposure apparatus 100 can be varied to suit specific requirements. The exposure apparatus 1100 may be mounted to/on a mounting base 102, such as the ground, a base, or floor, or some other supporting structure.

Apparatus Frame. The apparatus frame 1112 is rigid and supports and/or houses at least the SLM 1118 (this support is not shown), the optical assembly 1116, the wafer stage assembly 1120, and the illumination system 1114 (this support is not shown) above the mounting base 1102.

Illumination System. The illumination system 1114 includes an illumination source 1114A and an illumination optical assembly 1114B. In operation, the illumination source 1114A emits radiation 1114C to which the wafer/work-piece 1128 is exposed through the optical assembly 1116. On its way to the optical assembly 1116, the beam of radiation illuminates a portion of the SLM 1118 substantially transversely to gain, in reflection from the SLM, a spatial pattern of irradiation representing the pattern of the SLM 1118.

The illumination source 1114A can be, for example, any of a g-line source (436 nm), an i-line source (365 nm), a KrF excimer laser (248 nm), an ArF excimer laser (193 nm), a F2 laser (157 nm), or an EUV source (13.5 nm). The wafer-illuminating (exposure) light may be provided at about 193 nm (by an ArF excimer laser system, for example) light (with a wavelength of 193 nm), but it can also include ultraviolet light such as described in, for example, U.S. Pat. No. 7,023,610. The source 1114A of illuminating light may exploit harmonic frequency conversion or utilize an optical-fiber based amplifier, to produce radiation at a predetermined wavelength. Alternatively, the illumination source 1114A can generate charged particle beams such as an x-ray or an electron beam. For instance, in the case where an electron beam is used, thermionic emission type lanthanum hexaboride (LaB6) or tantalum (Ta) can be used as a cathode for an electron gun. Furthermore, in the case where an electron beam is used, the structure could be such that either a mask is used or a pattern can be directly formed on a substrate without the use of a mask.

Optical Assembly. The optical assembly 1116 projects and/or focuses the light passing through the reticle 1126 onto the work piece (wafer) 1128. Depending upon the design of the exposure apparatus 1100, the optical assembly 116 can scale (i.e., to magnify or reduce, with a specific coefficient) dimensions of the pattern of the reticle 1126. In a specific implementation, the optical assembly 1126 may simply relay the pattern of the reticle 1126 onto the wafer (i.e., have a unit magnification).

SLM Stage Assembly. The SLM stage assembly (not shown) holds and positions, (with the use of a reticle stage mover assembly 1118B) the SLM stage (not shown) that retains the SLM 1118 relative to the optical assembly 1116 and the wafer 11128. The reticle stage mover assembly 1118B can be designed to move the reticle stage along any of the x, y, z axes.

Wafer Stage Assembly. The wafer stage assembly 1120 holds and positions (with the use of a wafer stage mover 1120B) the wafer 1128 with respect to the image of the illuminated portion of the reticle 1126 projected onto the wafer. The wafer stage mover 1120B can be designed to move the wafer 1128 along any of the x, y, z axis. In one embodiment, the wafer 128 can be scanned while the wafer stage assembly 1120 moves the wafer 1128 along the y-axis.

Positioning System. The positioning system (1122A, 1122B, 1122C) monitors movement of the reticle 1126 and the wafer 1128 relative to the optical assembly 1116 or some other reference. As shown in FIG. 11, the position system 1122 includes (i) an AFS 1122A that maps the topography of the wafer 1128 relative to the optical assembly 1116 along the Z axis (which is collinear with the optical axis 1116A), about the X axis, and about the Y axis prior to exposure of the wafer with improved accuracy; (ii) a reticle measurement system 1122B (only a portion of which is illustrated) that monitors the position of the SLM stage and the SLM 1118; and (iii) a wafer measurement system 1122C (only a portion of which is illustrated) that monitors the position of the wafer stage 1120A along the X and Y axes, and about the Z axis. Due to operation of the position system, the wafer stage assembly 1120 can be controlled to position the wafer 1128 with improved accuracy. The positioning system 1122 can utilize laser interferometers, encoders, autofocus systems, and/or other measuring devices.

One implementation the autofocus system 1122A includes a reference system 1136 providing a reference signal used in conjunction with and related to the measurement of any changing operational parameter of the AFS 1122A but not the position of the wafer 1128 along the optical axis 1116A. The AFS 1122A further includes a measurement system 1138, which provides a measurement signal used in conjunction with and related to the measurement of anything changing in the AFS 1122A including (the change of, if present,) position of the wafer 1128 along the optical axis 1116A. By comparing the reference and measurement signals, the position of the wafer 1128 is measured, which is accompanied with reduction of the stability requirements for many of the components of the AFS 1122A.

A typical measurement system 1138 may include an encoder assembly (not shown) that measures, in operation, the position of a work piece (as shown—the wafer 1128). For example, in some embodiments, the encoder assembly can be designed to monitor and/or measure the position of the work piece along two axes (e.g., along the x- and y-axes). Additionally and/or alternatively, the encoder assembly can be designed to measure and/or monitor the position of the work piece 128 along all three axes (i.e., to specify the 3D position of the work piece 1128).

The conventional measurement system 1138 may also include a stage grating (not shown) that is secured to a side of the wafer stage 1120A (of the assembly 1120) that retains the work piece 1128, and one or more fixed encoder heads (not shown). The number of encoder heads and their mutual positioning and orientation can be varied according to the design of the exposure apparatus 1100 and/or the measurement system 1138, and the amount of travel of the stage 1120A along x- and y-axes. The use of multiple encoder heads enables the encoder assembly to more accurately measure the position of the stage 120A, and thus the position of the work piece 1128 that is retained by the stage 1120A. Examples of the structure(s) of the measurement system 1138 and encoder head(s) are discussed in detail in U.S. 2014/0049762, which is incorporated herein by reference, and will not be addressed here additionally.

Control System. The control system 1124 is operably connected to and governs the operation of at least the illumination system 1114, the SLM stage assembly, the wafer stage assembly 1120, and the positioning system 1122. The control system 1124 acquires measurement data, from the positioning system 1122, that represent position and/or orientation and/or movement of the reticle 1126 and/or wafer 1128 with respect to the optical assembly 1116 or another chosen reference. Based on these data, the control system 1124 controls the assemblies 1118, 1120 to precisely position the reticle 1118 and the wafer 1128. The control system 1124 can include one or more processors and electronic circuits, at least one of which may be specifically programmed to perform steps of data acquisition, data processing, and control of operation of the components of the apparatus 1100.

Generally, the exposure apparatus 1100 can be used as a scanning type photolithography system for optical transfer of a spatial pattern from the SLM 1126 onto the wafer 1128, with the SLM 1118 and the wafer 1128 optionally moving synchronously or one of them being stationary while another one is moving. Alternatively, the exposure apparatus 1120 can be used as a step-and-repeat type photolithography system that exposes the SLM 1118 while the SLM 1118 and the wafer 1128 are stationary. The use of the exposure apparatus 1100, however, is not limited to a photolithography system for semiconductor manufacturing and can include, as a non-limiting example, the use as an LCD photolithography system that projects a liquid crystal display device pattern onto a rectangular glass plate or a photolithography system for manufacturing of a thin film magnetic head.

In order to measure the operational status and "health" of the SLM 1118, the SLM 1118 can be moved away from the position in which it operates to deliver radiation towards the workpiece 1128) to a new position 1118', as shown with the arrow 1178. In position 1118' is chosen such that the mutual orientation of the SLM and the embodiment 1180 of the present invention (including substantially all elements of the embodiment 200 but without the SLM 204) lends itself to a substantially transverse illumination of the SLM with light 210, as shown schematically with the arrow 1182. Upon the completion of the measurement, the SLM can be removed from the exposure tool 1100 is so required or, in case of a "clean bill of health", returned to its operational position for continued exposure of the workpiece(s). In one example, with the practical motion of the individual mirrors of the SLM (operation of the pulsed laser source of the embodiment) at 2 MHz, and the data update may occur at 40 MHz.

It is understood, therefore, that embodiments of the invention provide for a highly sensitive, large field of view system and method for measuring the health of the SLM while it is installed on/in a digital scanner tool.

For example, while in the above-discussed embodiment the SLM is shown to be a so-called piston type SLM, in a related embodiment the SLM can be configured as a tilt-type SLM. In the above embodiment, the optical imaging system 200 irradiates the SLM at normal incidence, but the optical imaging system 200 irradiates the SLM at non-normally (that is, at a non-zero angle). In the above embodiment, the quarter-waveplate QWP may be rotatable about the optical axis or an axis parallel to the optical axis.

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value.

The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes. Other specific examples of the meaning of the terms "substantially", "about", and/or "approximately" as applied to different practical situations may have been provided elsewhere in this disclosure.

References throughout this specification to "one embodiment," "an embodiment," "a related embodiment," or similar language mean that a particular feature, structure, or characteristic described in connection with the referred to "embodiment" is included in at least one embodiment of the present invention. Thus, appearances of the phrases "in one embodiment," "in an embodiment," and similar language throughout this specification may, but do not necessarily, all refer to the same embodiment. It is to be understood that no portion of disclosure, taken on its own and in possible connection with a figure, is intended to provide a complete description of all features of the invention.

In addition, it is to be understood that no single drawing is intended to support a complete description of all features of the invention. In other words, a given drawing is generally descriptive of only some, and generally not all, features of the invention. A given drawing and an associated portion of the disclosure containing a description referencing such drawing do not, generally, contain all elements of a particular view or all features that can be presented is this view, for purposes of simplifying the given drawing and discussion, and to direct the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this detail in the drawing may be implied unless the context of the description requires otherwise. In other instances, well known structures, details, materials, or operations may be not shown in a given drawing or described in detail to avoid obscuring aspects of an embodiment of the invention that are being discussed. Furthermore, the described single features, structures, or characteristics of the invention may be combined in any suitable manner in one or more further embodiments.

The operation of embodiments of the invention has been described as including a specifically-programmed computer-readable processor/controller the operation of which is governed by instructions stored in a tangible, non-transitory storage memory. The memory may be random access memory (RAM), read-only memory (ROM), flash memory or any other memory, or combination thereof, suitable for storing control software or other instructions and data. Instruction information may be conveyed to a processor through communication media, including wired or wireless computer networks. In addition, while the invention may be embodied in software, the functions necessary to implement the invention may optionally or alternatively be embodied in part or in whole using firmware and/or hardware components, such as combinatorial logic, Application Specific Integrated Circuits (ASICs), Field-Programmable Gate Arrays (FPGAs) or other hardware or some combination of hardware, software and/or firmware components.

Disclosed aspects, or portions of these aspects, may be combined in ways not listed above. Accordingly, the invention should not be viewed as being limited to the disclosed embodiment(s).

The invention claimed is:

1. An optical imaging system comprising:
    an array of reflectors having an axis normal to a surface of the array;
    a first optical system configured to split an incident optical wavefront, impinging on the array along the axis into first and second optical wavefronts,
        wherein the first and second optical wavefronts have collinear normal vectors that are transversely shifted with respect to one another in a direction perpendicular to the axis; and
    an optical detector positioned to receive light from both the first and second optical wavefronts such as to detect interference fringes produced by interference between the first and second optical wavefronts.

2. An optical imaging system according to claim 1, wherein the first optical system includes a lateral shearing interferometer.

3. An optical imaging system according to claim 1, wherein the first optical system includes
    first, second, and third optical polarizer elements disposed immediately adjacently to one another along the axis; and
    a first optical lens element having a focal length and disposed between the first optical polarizer element and the array of reflectors.

4. An optical imaging system according to claim 3, wherein an axial separation between the array of reflectors and the optical detector is substantially equal to a quadrupled value of said focal length.

5. An optical imaging system according to claim 3, further comprising a second optical lens element having the focal length and configured to focus a collimated beam of light, arriving thereon from the array of reflectors, at a focal point of the first optical lens element.

6. An optical imaging system according to claim 3, wherein the first optical polarizer element includes a Savart plate, wherein a position of the second optical polarizer element is fixed, and wherein the third optical polarizer element is configured to be rotatable about the axis.

7. An optical imaging system according to claim 3,
wherein the first optical polarizer element is configured to define said first and second optical wavefronts having first and second states of polarization of light, respectively, at an axial point between the first and second optical polarizer elements; and
wherein the first and second states of polarization of light at said axial point are orthogonal to one another when light, forming the optical wavefront that is incident onto the first optical system along the axis is linearly polarized.

8. An optical imaging system according to claim 3,
wherein the second optical polarizer element is configured to transform the first and second states of polarization into respectively-corresponding third and fourth states of polarization upon propagation of the first and second optical wavefronts through the second optical polarizer element,
wherein any of the third and fourth states of polarization is different from any of the first and second states of polarization, and
wherein the third and fourth states of polarization are orthogonal to one another.

9. The optical imaging system according to claim 1, wherein the first optical system further comprises a beam splitter disposed across the axis between the array of reflectors and the optical detector.

10. The optical imaging system according to claim 9, wherein the first optical system further includes first and second co-axially positioned lens elements, and wherein the beamsplitter is positioned between first and second lens elements.

11. The optical imaging system according to claim 10, wherein the focal point of the first lens element and the focal point of the second lens element coincide with one another.

12. An exposure apparatus configured to expose a workpiece with an exposure radiation by bouncing the exposure radiation off of the array of reflectors, the apparatus comprising:
an illuminator configured to irradiate the array of reflectors with the exposure radiation delivered from a radiation source;
a projection optics configured to form, on the workpiece, a pattern of radiation with the exposure radiation received in reflection from the array of reflectors; and
the optical imaging system according to claim 1.

13. An exposure apparatus according to claim 12, further comprising
an array holding device, dimensioned to hold the array of reflectors and configured to reposition the array of reflectors between a first position and a second position, the first position being a position where the array of reflectors is placed across a radiation path of the exposure radiation, and the second position being where the array of reflectors is placed to not cross said radiation path.

14. An inspection apparatus configured to inspect an array of reflective surfaces arranged on a first surface, the inspection apparatus comprising:
an irradiating system configured to irradiate said array with a first radiation;
an optical system having a first axis, the first axis being an optical axis of the optical system, the optical system (i) disposed to receive a second radiation from the array and deliver said second radiation to a second surface, the first and second surfaces being optically-conjugate to one another,
wherein the second radiation includes the first radiation reflected by said array, and
(ii) including a radiation divider configured to divide the second radiation into first and second portions of the second radiation, each of the first and second portions continuing to propagate towards the second surface; and
an optical detector disposed on the second surface and configured to receive and detect the first and second portions of the second radiation.

15. The inspection apparatus of claim 14, wherein the radiation divider is configured to define first and second states of polarization, the first state of polarization being a state of polarization of the first portion of the second radiation, the second state of polarization being a state of polarization of the second portion of the second radiation, the first and second states of polarization being different from one another.

16. The inspection apparatus of claim 15, wherein the optical system includes an optical member that is
(a) disposed between the radiation divider and the optical detector, and
(b) configured
to receive the first portion of the second radiation and transform said first portion of the second radiation into a third radiation having a third state of polarization, and
to receive the second portion of the second radiation and transform said second portion of the second radiation into a fourth radiation having a fourth state of polarization state.

17. The inspection apparatus of claim 16, wherein said optical member includes a polarization-transforming optical component configured
to transform the first portion into a fifth radiation having a fifth state polarization, and
to transform the second portion of the second radiation into a sixth radiation having a state of polarization.

18. The inspection apparatus of claim 17, wherein the optical member includes a polarization-extracting element configured to extract the third radiation of the third state of polarization from the fifth radiation of the fifth state of polarization, and further configured to extract the third radiation of the third state of polarization state from the sixth radiation of the sixth state of polarization.

19. The inspection apparatus of claim 18, wherein the optical member includes an optical polarizer.

20. The inspection apparatus of claim 19, wherein the optical polarizer is configured to be rotatable about the first axis or about a second axis that is parallel to the first axis.

21. The inspection apparatus of claim 17, wherein the optical member includes an optical wave plate.

22. The inspection apparatus of claim 14, wherein the radiation divider includes a Savart plate.

23. The inspection apparatus of claim 14,
wherein the optical system includes an imaging optical system disposed to optically image the first and second surfaces on to one another, and
wherein the radiation divider is positioned between the imaging optical system and the optical detector.

24. An exposure apparatus configured to expose a workpiece with exposure radiation by bouncing the exposure radiation off of a mirror array, the apparatus comprising:

an illuminator configured to irradiate the mirror array with the exposure radiation delivered from a radiation source;
a projection optics configured to form, on the workpiece, a pattern of radiation with the exposure radiation received in reflection from the mirror array; and
the inspection apparatus of claim 14.

25. A method for exposure of the workpiece with exposure radiation via a mirror array, the method comprising:
illuminating the mirror array with the exposure radiation;
forming a radiation pattern on the workpiece with the exposure radiation delivered from the mirror array; and
inspecting the mirror array with the inspection apparatus of claim 14 to determine an operational characteristic of said array.

26. An exposure apparatus configured to expose a workpiece with an exposure radiation by bounding the exposure radiation off of a mirror array, the apparatus comprising:
an illuminator configured to irradiate the mirror array with the exposure radiation delivered from a radiation source;
a mirror array holding device, dimensioned to hold the mirror array and configured to reposition the mirror array between a first position and a second position, the first position being a position where the mirror array is placed across a radiation path of the exposure radiation, and the second position being where the mirror array is placed outside of said radiation path;
a projection optics configured to form a radiation pattern on the workpiece with the exposure radiation received by the projection optics from the mirror array; and
an inspection apparatus structured to optically measure an operational parameter of the mirror array when the mirror array is in the second position.

* * * * *

UNITED STATES PATENT AND TRADEMARK OFFICE
CERTIFICATE OF CORRECTION

PATENT NO. : 10,267,625 B2
APPLICATION NO. : 15/897248
DATED : April 23, 2019
INVENTOR(S) : Eric Peter Goodwin It is certified that error appears in the above-identified patent and that said Letters Patent is hereby corrected as shown below:

In the Claims

Column 18, Lines 36-42:
"17. The inspection apparatus of claim 16, wherein said optical member includes a polarization-transforming optical component configured
    to transform the first portion into a fifth radiation having
        a fifth state polarization, and
to transform the second portion of the second radiation into
a sixth radiation having a state of polarization."

Should read:
--17. The inspection apparatus of claim 16, wherein said optical member includes a polarization-transforming optical component configured
    to transform the first portion of the second radiation into
a fifth radiation having
        a fifth state of polarization, and
to transform the second portion of the second radiation into
a sixth radiation having a sixth state of polarization.--

Signed and Sealed this
Twenty-fourth Day of December, 2019

Andrei Iancu
*Director of the United States Patent and Trademark Office*